United States Patent
Koyama

(10) Patent No.: US 8,321,711 B2
(45) Date of Patent: *Nov. 27, 2012

(54) SEMICONDUCTOR DEVICE HAVING A THRESHOLD VOLTAGE CONTROL FUNCTION

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/171,549

(22) Filed: Jun. 29, 2011

(65) Prior Publication Data

US 2011/0255326 A1    Oct. 20, 2011

Related U.S. Application Data

(63) Continuation of application No. 12/357,594, filed on Jan. 22, 2009, now Pat. No. 7,987,379, which is a continuation of application No. 10/597,193, filed as application No. PCT/JP2005/001542 on Jan. 27, 2005, now Pat. No. 7,487,373.

(30) Foreign Application Priority Data

Jan. 30, 2004    (JP) ................................ 2004-024248

(51) Int. Cl.
    G06F 1/32    (2006.01)
(52) U.S. Cl. .................. 713/323; 713/300; 713/320
(58) Field of Classification Search .................. None
    See application file for complete search history.

(56) References Cited

U.S. PATENT DOCUMENTS

| | | |
|---|---|---|
| 4,591,848 A | 5/1986 | Morozumi et al. |
| 4,897,662 A | 1/1990 | Lee et al. |
| 5,132,819 A | 7/1992 | Noriyama et al. |
| 5,457,474 A | 10/1995 | Ikeda |
| 5,461,338 A | 10/1995 | Hirayama et al. |
| 5,477,073 A | 12/1995 | Wakai et al. |
| 5,552,637 A | 9/1996 | Yamagata |
| 5,557,231 A | 9/1996 | Yamaguchi et al. |

(Continued)

FOREIGN PATENT DOCUMENTS

EP    0564204 A2    10/1993

(Continued)

OTHER PUBLICATIONS

PCT Written Opinion (PCT Application No. PCT/JP2005/001542) mailed May 10, 2005 (3 pages).

(Continued)

*Primary Examiner* — Dennis M Butler
(74) *Attorney, Agent, or Firm* — Fish & Richardson P.C.

(57) ABSTRACT

The invention provides a semiconductor device that power is stabilized by suppressing power consumption as much as possible. The semiconductor device of the invention includes a logic portion and a memory portion each including a plurality of transistors, a detecting portion for detecting one or both of operation frequencies of the logic portion and the memory portion, a Vth control for supplying a Vth control signal to one or both of the logic portion and the memory portion, and an antenna. Each of the plurality of transistors has a first gate electrode which is input with a logic signal, a second gate electrode which is input with the Vth control signal, and a semiconductor film such that the second gate electrode, the semiconductor film, and the first gate electrode are provided in this order from the bottom.

24 Claims, 10 Drawing Sheets

U.S. PATENT DOCUMENTS

| | | | |
|---|---|---|---|
| 5,644,147 A | 7/1997 | Yamazaki et al. |
| 5,807,772 A | 9/1998 | Takemura |
| 5,814,834 A | 9/1998 | Yamazaki et al. |
| 5,818,070 A | 10/1998 | Yamazaki et al. |
| 5,821,137 A | 10/1998 | Wakai et al. |
| 5,834,797 A | 11/1998 | Yamanaka |
| 5,917,221 A | 6/1999 | Takemura |
| 5,956,011 A | 9/1999 | Koyama et al. |
| 6,000,036 A | 12/1999 | Durham et al. |
| 6,010,923 A | 1/2000 | Jinno |
| 6,037,924 A | 3/2000 | Koyama et al. |
| 6,072,193 A | 6/2000 | Ohnuma et al. |
| 6,081,131 A | 6/2000 | Ishii |
| 6,150,283 A | 11/2000 | Ishiguro |
| 6,153,893 A | 11/2000 | Inoue et al. |
| 6,166,577 A | 12/2000 | Mizuno et al. |
| 6,197,624 B1 | 3/2001 | Yamazaki |
| 6,198,133 B1 | 3/2001 | Yamazaki et al. |
| 6,204,519 B1 | 3/2001 | Yamazaki et al. |
| 6,207,971 B1 | 3/2001 | Jinno et al. |
| 6,285,248 B1 | 9/2001 | Hiratsuka |
| 6,335,895 B1 | 1/2002 | Sugibayashi |
| 6,342,717 B1 | 1/2002 | Komatsu |
| 6,388,483 B1 | 5/2002 | Mizuno et al. |
| 6,388,509 B2 | 5/2002 | Hiratsuka |
| 6,392,628 B1 | 5/2002 | Yamazaki et al. |
| 6,404,644 B1 | 6/2002 | Ikefuji et al. |
| 6,447,448 B1 | 9/2002 | Ishikawa et al. |
| 6,462,723 B1 | 10/2002 | Yamazaki et al. |
| 6,472,916 B2 | 10/2002 | Mizuno et al. |
| 6,489,833 B1 | 12/2002 | Miyazaki et al. |
| 6,512,271 B1 | 1/2003 | Yamazaki et al. |
| 6,513,124 B1 | 1/2003 | Furuichi et al. |
| 6,569,716 B1 | 5/2003 | Suzuki |
| 6,597,220 B2 | 7/2003 | Mizuno et al. |
| 6,603,453 B2 | 8/2003 | Yamazaki et al. |
| 6,608,509 B1 | 8/2003 | Mizuno et al. |
| 6,608,613 B2 | 8/2003 | Koyama et al. |
| 6,774,706 B2 | 8/2004 | Miyazaki et al. |
| 6,819,158 B2 | 11/2004 | Mizuno et al. |
| 6,838,773 B2 | 1/2005 | Kikuchi et al. |
| 6,842,396 B2 | 1/2005 | Kono |
| 6,922,134 B1 | 7/2005 | Yones |
| 6,960,787 B2 | 11/2005 | Yamazaki et al. |
| 6,990,572 B2 | 1/2006 | Ando |
| 7,012,327 B2 | 3/2006 | Huff et al. |
| 7,138,852 B2 | 11/2006 | Miyazaki et al. |
| 7,161,408 B2 | 1/2007 | Mizuno et al. |
| 7,247,882 B2 | 7/2007 | Yamazaki et al. |
| 7,487,373 B2 * | 2/2009 | Koyama .................. 713/323 |
| 7,987,379 B2 * | 7/2011 | Koyama .................. 713/323 |
| 2001/0038308 A1 | 11/2001 | Hiratsuka |
| 2003/0048125 A1 | 3/2003 | Miyazaki et al. |
| 2004/0207011 A1 | 10/2004 | Iwata et al. |
| 2005/0023530 A1 | 2/2005 | Koyama |
| 2005/0158929 A1 | 7/2005 | Yamazaki et al. |
| 2006/0011288 A1 | 1/2006 | Watanabe et al. |
| 2007/0206138 A1 | 9/2007 | Takizawa et al. |
| 2008/0044940 A1 | 2/2008 | Watanabe et al. |
| 2008/0093464 A1 | 4/2008 | Dairiki et al. |

FOREIGN PATENT DOCUMENTS

| | | |
|---|---|---|
| EP | 0836194 A2 | 4/1998 |
| JP | 06-021443 A | 1/1994 |
| JP | 06089574 A | 3/1994 |
| JP | 07-074282 A | 3/1995 |
| JP | 08-274620 A | 10/1996 |
| JP | 10069330 A | 3/1998 |
| JP | 11-031784 A | 2/1999 |
| JP | 11353052 A | 12/1999 |
| JP | 2000-252470 A | 9/2000 |
| JP | 2000-339961 A | 12/2000 |
| JP | 2001-051292 A | 2/2001 |
| JP | 2001-277726 A | 10/2001 |
| JP | 2001-298090 A | 10/2001 |
| JP | 2002-041160 A | 2/2002 |
| JP | 2002-083894 A | 3/2002 |
| JP | 2003-031697 A | 1/2003 |
| JP | 2003-086706 A | 3/2003 |
| JP | 2004-118255 A | 4/2004 |
| WO | 9910796 A1 | 3/1999 |
| WO | WO 99/26290 A1 | 5/1999 |
| WO | WO 03/009385 A1 | 1/2003 |

OTHER PUBLICATIONS

PCT International Search Report (PCT Application No. PCT/JP2005/001542) mailed May 10, 2005 (3 pages).

* cited by examiner

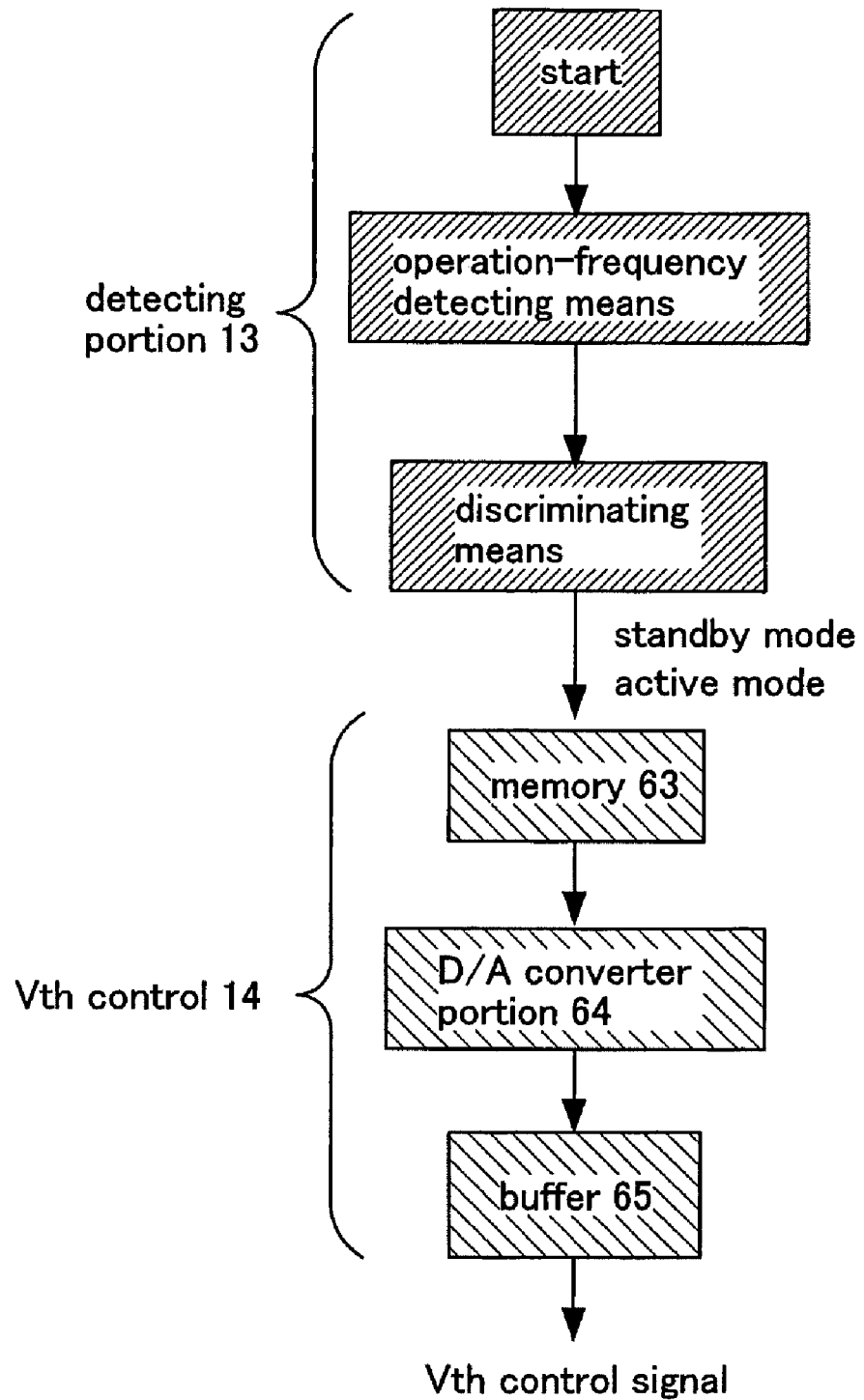

SEMICONDUCTOR DEVICE HAVING A THRESHOLD VOLTAGE CONTROL FUNCTION

CROSS-REFERENCE TO RELATED APPLICATIONS

This application is a continuation of U.S. application Ser. No. 12/357,594, filed Jan. 22, 2009, now allowed, which is a continuation of U.S. application Ser. No. 10/597,193, filed Jul. 14, 2006, now U.S. Pat. No. 7,487,373, which is a 371 of International Application No. PCT/JP2005/001542, filed Jan. 27, 2005, now WO 2005/074030, which claims the benefit of a foreign priority application filed in Japan as Serial No. 2004-024248 on Jan. 30, 2004, all of which are incorporated by reference.

TECHNICAL FIELD

The present invention relates to a semiconductor device capable of transmitting and receiving data.

BACKGROUND ART

In recent years, a semiconductor device has been developed and used as a CPU and a memory. Among them, a semiconductor device which consumes large power has a problem that a larger battery and a cooling fan are required, thereby the electronic apparatus itself is increased in size. In view of the foregoing, a composite semiconductor device is suggested, which has a structure where a wiring substrate and a package are attached to each other so as to satisfy high thermal conductivity and low elasticity.
[Patent Document 1]
Japanese Patent Laid-Open No. 07-74282

A semiconductor device capable of transmitting and receiving data has been developed, which is called a wireless tag, an RFID tag, or the like. The semiconductor device which has been put to practical use comprises an antenna and a circuit formed using a semiconductor substrate (an IC chip) in many cases. The IC chip comprises a plurality of transistors each of which has a fixed threshold voltage.

DISCLOSURE OF INVENTION

In a wireless tag, power is difficult to be stabilized and power consumption is required to be suppressed as much as possible because the power is supplied from an antenna. In addition, a wireless tag carries out complex processes such as reading out data from a storage medium and a cryptanalysis. In order to carry out such a complex process as the cryptanalysis, there has been a problem that high power consumption has been required. As the power consumption is increased, strong electromagnetic waves are required to be input, there has been a problem that high power consumption of a reader/writer has been needed and other device and the human body have been adversely affected, for example. Furthermore, the communication distance between the wireless tag and the reader/writer has been restricted.

In view of the foregoing, the invention provides a semiconductor device in which stabilization of power is achieved by suppressing the power consumption as much as possible. In addition, the invention provides a semiconductor device in which power is not unstable due to a complex process such as a cryptanalysis and stabilization of the power is achieved. Furthermore, the invention provides a semiconductor device in which strong electromagnetic waves are not required to be input and the communication distance to a reader/writer is improved.

The invention takes the following measures in order to solve the aforementioned problem of conventional art.

A semiconductor device of the invention comprises a logic portion and a memory portion each including a plurality of transistors, a detecting portion for detecting operation frequencies of one or both of the logic portion and the memory portion, a Vth control for supplying a Vth control signal to one or both of the logic portion and the memory portion, and an antenna. Each of the plurality of transistors has a first gate electrode which is input with a logic signal, a second gate electrode which is input with the Vth control signal, and a semiconductor film such that the second gate electrode, the semiconductor film, and the first gate electrode are provided in this order from the bottom.

In addition, a semiconductor device of the invention may comprise a substrate provided with a plurality of transistors. Alternatively, a semiconductor device of the invention may comprise a substrate provided with a plurality of transistors and an antenna. Alternatively, a semiconductor device of the invention comprises a substrate provided with a plurality of transistors and a base provided with an antenna such that the substrate and the base may be attached to each other so as to connect the plurality of transistors to the antenna.

In addition, in a semiconductor device of the invention, a substrate may be a glass substrate or a flexible substrate. In addition, a logic portion may comprise more than one of a control circuit, an arithmetic circuit, an input/output circuit, a power source circuit, a clock generating circuit, a data demodulation/modulation circuit, and an interface circuit. In addition, a detecting portion may be a program or a storage medium storing the program.

According to the invention having the above-described constitution, a semiconductor device in which low power consumption is achieved can be provided. Therefore, such a semiconductor device can be provided that power is not unstable due to a complex process such as a cryptanalysis and stable operation is achieved. In addition, such a semiconductor device can be provided that strong electromagnetic waves are not required to be input and the communication distance to a reader/writer is improved.

BRIEF DESCRIPTION OF DRAWINGS

FIG. 3 is a diagram illustrating constitution of a semiconductor device of the invention.

BEST MODE FOR CARRYING OUT THE INVENTION

Figure 1:
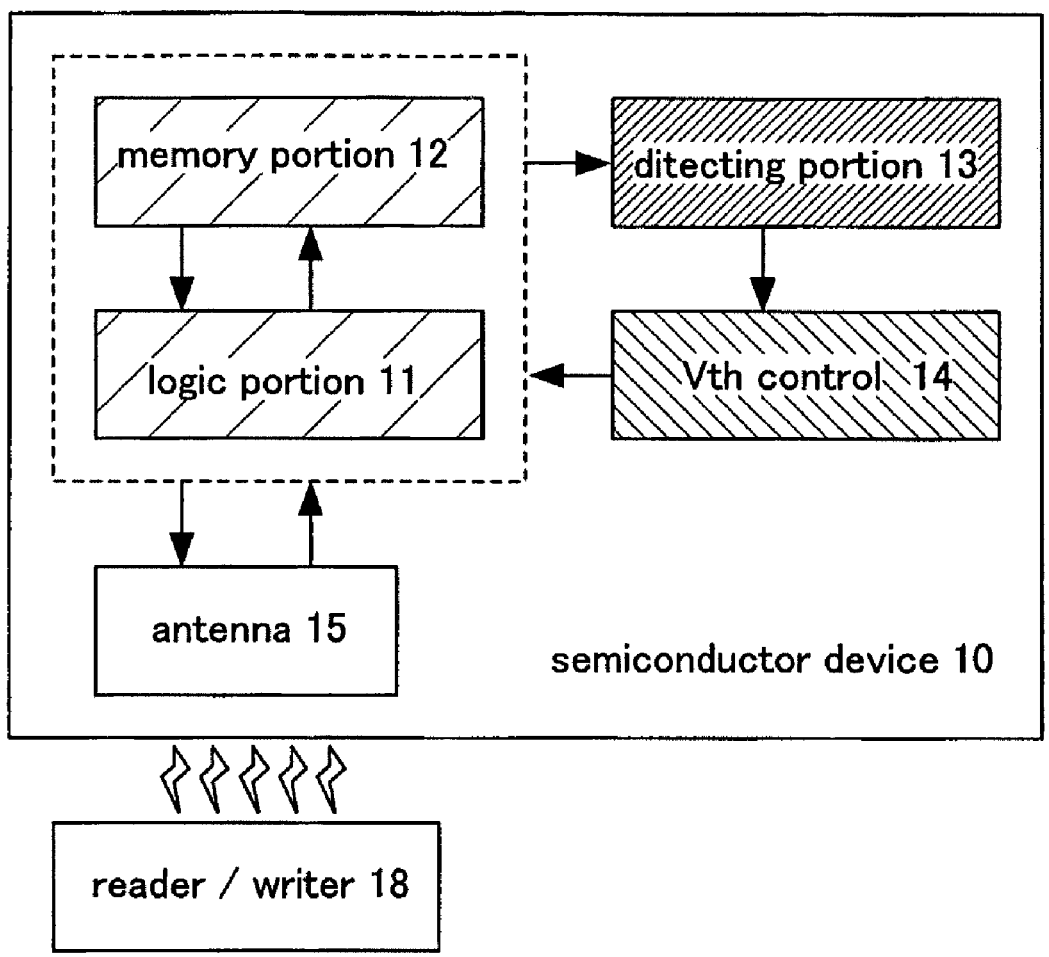
FIG. 1 is a diagram illustrating constitution of a semiconductor device of the invention.

Although the invention will be specifically described by way of embodiments with reference to the accompanying drawings, it is to be understood that various changes and modifications will be apparent to those skilled in the art. Therefore, unless such changes and modifications depart from the scope of the invention, they should be construed as being included in the invention. Therefore, the invention should not be interpreted as being limited to the disclosure of the embodiments. Note that identical portions in constitution of the invention are denoted by the same reference numerals in different drawings.

A semiconductor device 10 of the invention comprises a logic portion 11, a memory portion 12, a detecting portion 13, a Vth control 14, and an antenna 15 (see FIG. 1). The semiconductor device 10 of the invention communicates data in noncontact manner. The logic portion 11 is more than one of a power source circuit, a clock generating circuit, a data demodulation/modulation circuit, an interface circuit, a control circuit, an arithmetic circuit, and an input/output circuit. The control circuit, the arithmetic circuit, and the input/output circuit are components of a CPU (Central Processing Unit). The power source circuit functions to generate power sources for respective circuits in the semiconductor device based on alternating signals input from the antenna 15. The clock generating circuit functions to generate clocks for respective circuits in the semiconductor device based on alternating signals input from the antenna 15. The data demodulation/modulation circuit functions to demodulate and modulate data for communicating with a reader/writer 18. The antenna 15 functions to transmit and receive an electromagnetic field and radio waves. The reader/writer 18 controls the communication with the semiconductor device, the control, and the processing of data thereof Note that the logic portion 11 is not limited to this constitution and can take various constitution. For example, another component such as a compensatory circuit of power source voltage and hardware dedicated to a cryptanalysis is additionally provided. The memory portion 12 is one or more of a DRAM (Dynamic Random Access Memory), an SRAM (Static Random Access Memory), an FeRAM (Ferroelectric Random Access Memory), a masked ROM (masked Read Only Memory), a fuse PROM (fuse Programmable Read Only Memory), an anti-fuse PROM, an EPROM (Electrically Programmable Read Only Memory), an EEPROM (Electrically Erasable Programmable Read Only Memory), a flash memory, and the like.

Figure 2A:
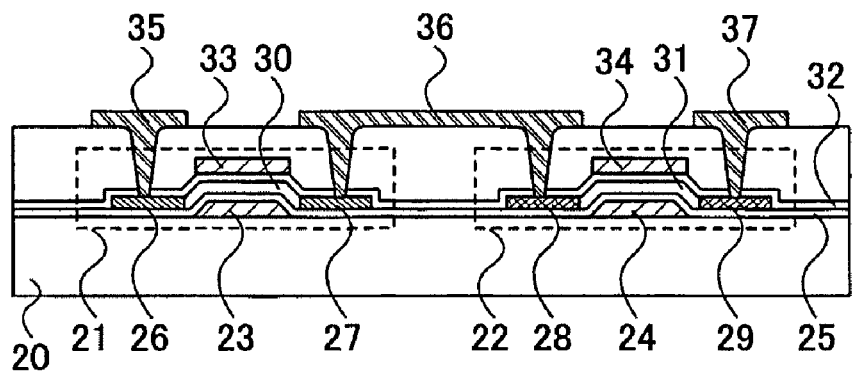
FIGS. 2A to 2C are diagrams illustrating constitution of a semiconductor device of the invention.
Figure 2B:
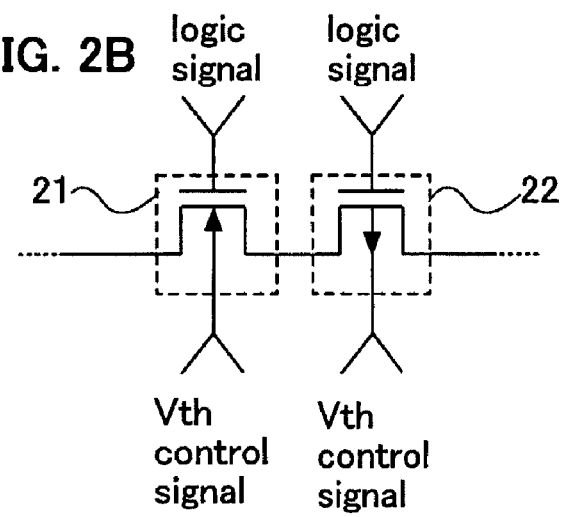

The logic portion 11 and the memory portion 12 each includes a plurality of transistors. Each of the transistors has a first gate electrode which is input with a logic signal and a second gate electrode which is input with a Vth control signal. Description below is made on a structure of the transistor having the first and second gate electrodes (see FIGS. 2A and 2B). In the drawings, an n-type transistor 21 and a p-type transistor 22 are exemplarily shown as the plurality of transistors.

The n-type transistor 21 and the p-type transistor 22 are formed over a substrate 20 made of glass, quartz, plastic, metal oxide, or silicon. The n-type transistor 21 has a first gate electrode 33, a semiconductor film including source and drain regions (also called impurity regions) 26 and 27 and a channel forming region 30, and a second gate electrode 23. The p-type transistor 22 has a first gate electrode 34, a semiconductor film including source and drain regions 28 and 29 and a channel forming region 31, and a second gate electrode 24. A first gate insulating film 32 is provided between the first gate electrode 33/34 and the semiconductor film. A second gate insulating film 25 is provided between the second gate electrode 23/24 and the semiconductor film. Moreover, source and drain wirings 35 to 37 connected to the source and drain regions 26 to 29 are provided over the substrate 20.

Figure 2C:
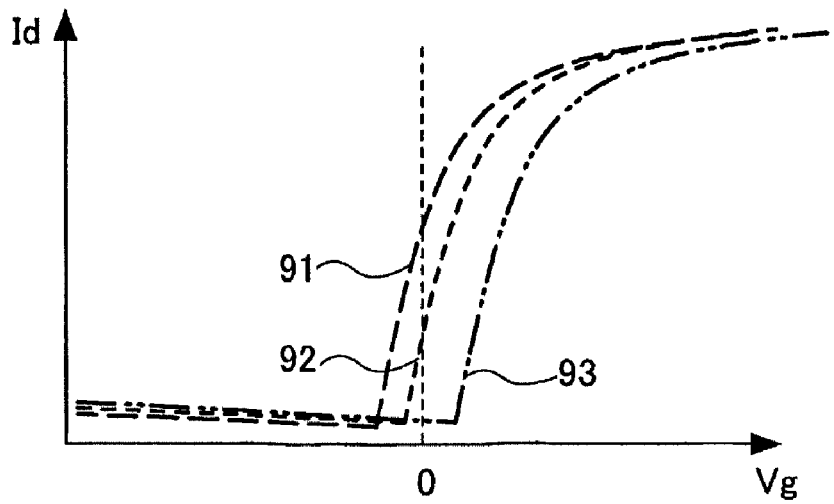

Next, a characteristic between drain current ($I_d$) and gate voltage ($V_g$) of the above-mentioned transistor having the first and second gate electrodes is described (see FIG. 2C). A curve 91 shows the characteristic when the second gate electrode of the transistor is applied with positive voltage, a curve 92 shows the characteristic when the second gate electrode is applied with 0 V, and a curve 93 shows the characteristic when the second gate electrode is applied with negative voltage.

As shown here, when the second gate electrode is applied with positive voltage, the curve is shifted to the left and the threshold voltage falls. On the other hand, when the second gate electrode is applied with negative voltage, the curve is shifted to the right and the threshold voltage rises. The invention utilizes this phenomenon such that the second gate electrode is applied with positive voltage to lower the threshold voltage in the case where high-speed operation is required, whereas the second gate electrode is applied with negative voltage to increase the threshold voltage in the case where power consumption is to be reduced by reducing leakage current.

The detecting portion 13 comprises an operation-frequency detecting means for detecting operation frequencies of the logic portion 11 and the memory portion 12, and a discriminating means for discriminating operation modes of the logic portion 11 and the memory portion 12 (see FIG. 3). The operation-frequency detecting means counts how many times a certain instruction is used in a certain period. The discriminating means compares an output of the operation-frequency detecting means with a reference value stored in the memory, and the operation mode is recognized as a first mode (a standby mode) if the output of the operation-frequency detecting means is equal to or smaller than the reference value. On the other hand, if the output of the operation-frequency detecting means is equal to or larger than the reference value, the operation mode is recognized as a second mode (an active mode). The detecting portion 13 is a program or a storage medium storing the program. Note that the memory for storing the reference value can be provided inside or outside the semiconductor device.

The Vth control 14 comprises a memory 63, a D/A converter portion 64, and a buffer 65 (see FIG. 3). The memory 63 receives data on a detection result from the detecting portion 13 to store it. The D/A converter portion 64 converts the stored data into analog voltage. The buffer 65 outputs the analog voltage after buffering and outputs a Vth control signal. Here, a Vth control signal for making threshold voltage high is output to a transistor in a block of the logic portion 11 and the memory portion 12 in a standby mode, whereas a Vth control signal for making threshold voltage low is output to a transistor in a block of the logic portion 11 and the memory portion 12 in an active mode. By being supplied with the Vth control signal for setting high threshold voltage, the transistor of the block in a standby mode surely turns OFF. Consequently, leakage current is reduced and low power consumption is achieved. On the other hand, by being supplied with the Vth control signal for setting low threshold voltage, high-speed operation of the transistor of the block in an active mode is achieved.

Note that a Vth control signal is supplied to both of the blocks in a standby mode and in an active mode herein, however, the invention is not limited to this and the Vth control signal may be supplied to either block in a standby mode or in an active mode. Constitution of the Vth control 14 is not limited to the above constitution. For example, in the case where the logic portion 11 and the memory portion 12 have a plurality of blocks, the memory 63, the D/A converter portion 64, and the buffer 65 may be provided per the block.

A non-contact type semiconductor device is described hereabove, however, the invention is not limited to this and may be a contact type.

Embodiment 1

Figure 4A:
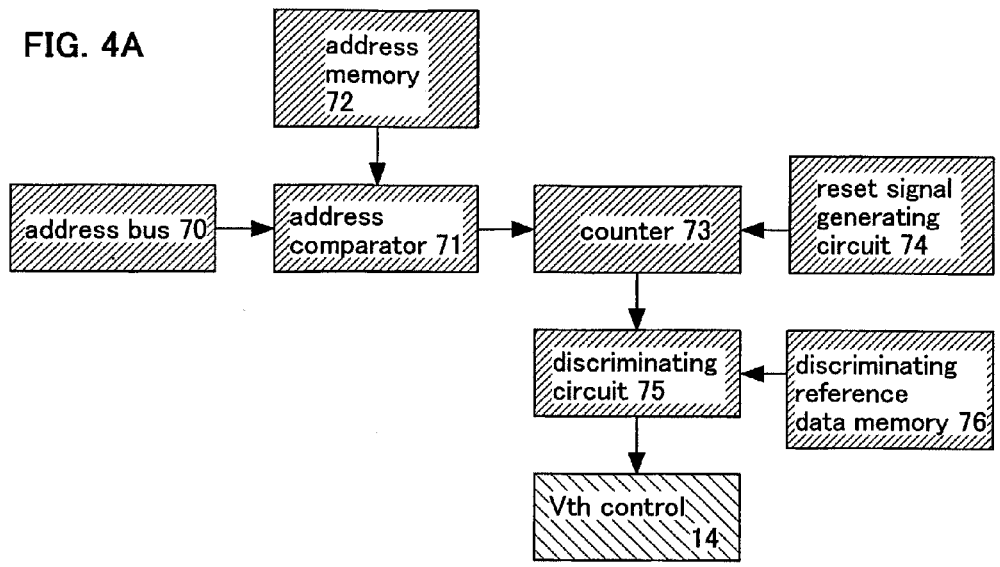
FIGS. 4A and 4B are diagrams illustrating constitution of a semiconductor device of the invention.
Figure 4B:
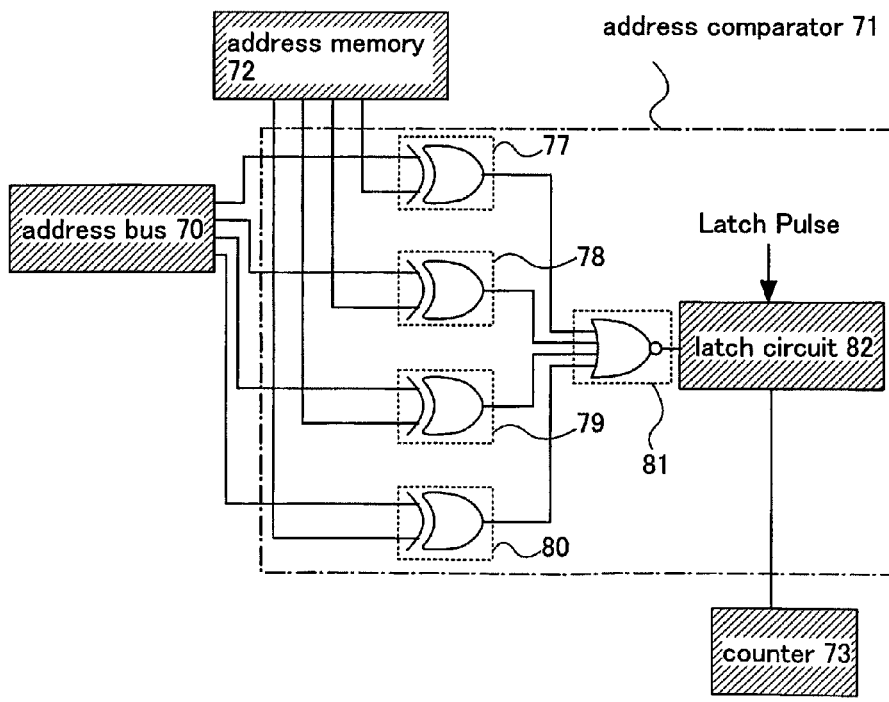

Constitution of the operation-frequency detecting means and the discriminating means in the detecting portion 13 is described using FIGS. 4A and 4B. The operation-frequency detecting means includes an address comparator 71, an address memory 72, a counter 73, and a reset signal generating circuit 74. The discriminating means includes a discriminating circuit 75 and a discriminating reference data memory 76.

The address comparator 71 is connected to an address bus 70 and the address memory 72. First address data is input from the address bus 70. The first address data and second address data which is input to the address memory 72 are compared with each other by the address comparator 71. When the first address data and the second address data agree with each other, a signal showing the agreement is output to the counter 73. The counter 73 counts an output of the address comparator 71. The reset signal generating circuit 74 outputs a reset signal periodically to the counter 73.

In the case where one reset signal is input to the counter 73 per 0.01 seconds, for example, the counter 73 counts how many times the first address data and second address data agree with each other for 0.01 seconds.

Note that a known counter having a reset terminal can be used as the counter 73. The reset signal generating circuit 74 divides a fixed frequency signal such as a clock signal into the required number.

The discriminating circuit 75 compares an output of the counter 73 with a reference value stored in the discriminating reference data memory 76. In the case where the output of the counter 73 is equal to or larger than the reference value, the Vth control 14 is operated to supply a Vth control signal for making threshold voltage low. Meanwhile, in the case where the output of the counter 73 is equal to or smaller than the reference value, the Vth control 14 is operated to supply a Vth control signal for making threshold voltage high. Specifically, a reference value in the discriminating reference data memory 76 is subtracted from an output of the counter 73. The Vth control 14 is operated when the difference becomes 0 from a positive value or when the difference becomes 0 from a negative value. In addition, the Vth control 14 is operated when the difference becomes a negative value from 0 or when the difference becomes a positive value from 0.

When a reference value stored in the discriminating reference data memory 76 is subtracted from an output of the counter 73, and the difference becomes 0 from a positive value or when the difference becomes 0 from a negative value, the Vth control 14 supplies a Vth control signal for making the threshold voltage low, a Vth control signal for making the threshold voltage high, or no Vth control signal.

When the difference becomes a negative value from 0, the Vth control 14 supplies a Vth control signal for making the threshold voltage high.

Meanwhile, when the difference becomes a positive value from 0, the Vth control 14 supplies a Vth control signal for making the threshold voltage low.

A constitution of the address comparator 71 is described next. The case of a 4-bit is illustrated here for simplicity. Address data of each bit of the address bus 70 and the address memory 72 is input to each of input nodes of EXOR circuits 77 to 80. Outputs of the EXOR circuits 77 to 80 are input to input nodes of an NOR circuit 81. An output node of the NOR circuit 81 is connected to a latch circuit 82. A latch pulse is input to the latch circuit 82 to latch data after ON/OFF switching is terminated. Note that the latch circuit 82 is provided for preventing a glitch in switching the operation and is not necessarily provided.

Embodiment 2

Figure 5:
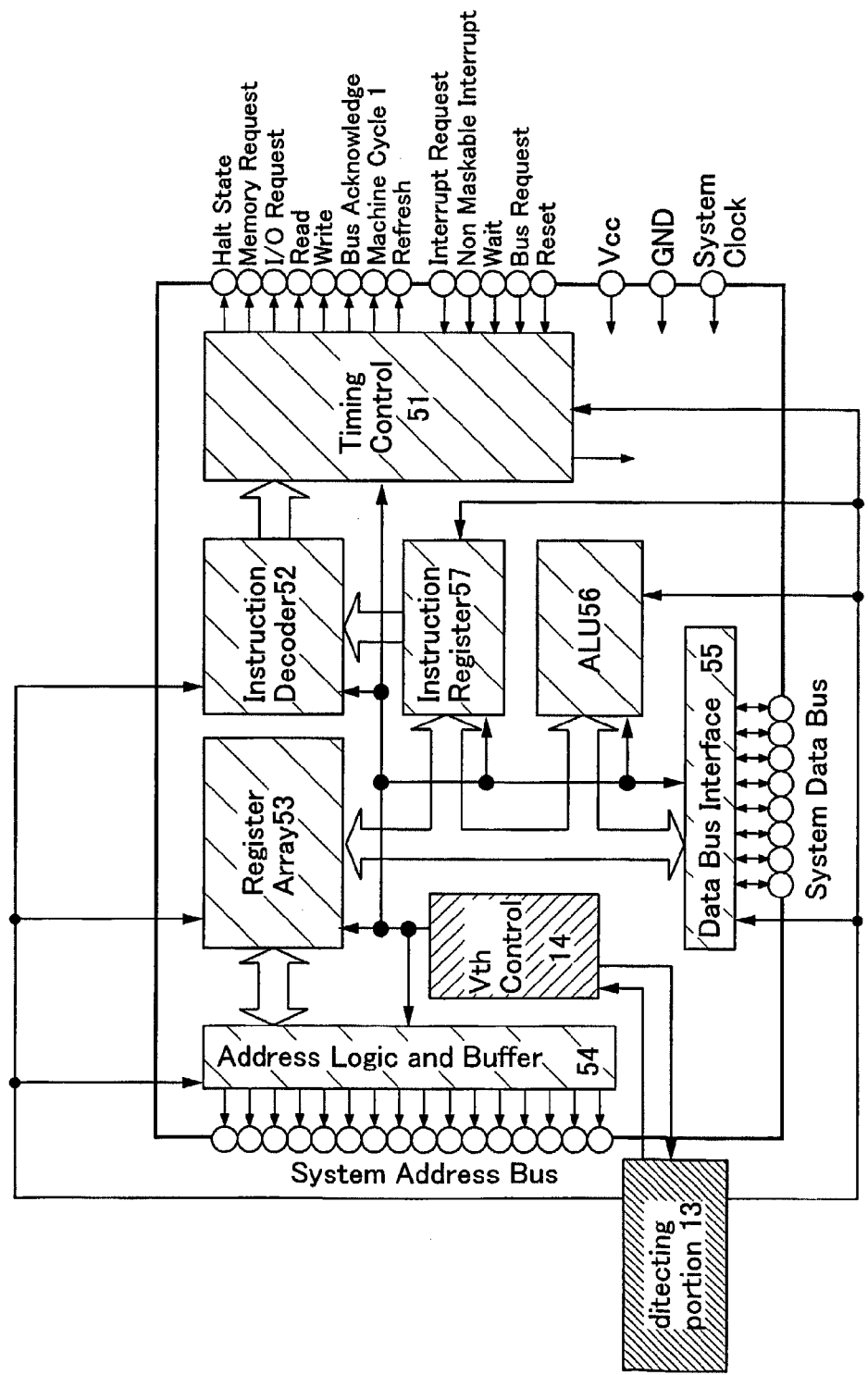
FIG. 5 is a diagram illustrating constitution of a semiconductor device of the invention.

Constitution of the logic portion 11, which is one of the above-mentioned five components of the invention (the logic portion 11, the memory portion 12, the detecting portion 13, the Vth control 14, and the antenna 15), is described in detail using FIG. 5. A semiconductor device corresponding to a CPU is illustrated for description here.

The semiconductor device corresponding to a CPU comprises a timing control 51, an instruction decoder 52, a register array 53, an address logic and buffer 54, a data bus interface 55, an ALU (Arithmetic Logic Unit) 56, an instruction register 57, the detecting portion 13, and the Vth control 14. The timing control 51, for example, receives an instruction from the outside and converts it into data for the inside to transmit to another block, and provides an instruction of reading or writing of memory data, or the like to the outside depending on the inside operation. The instruction decoder 52 converts an outside instruction into an instruction for the inside. The register array 53 is a volatile memory to temporarily hold data. The address logic and buffer 54 specifies an address of an external memory. The data bus interface 55, for example, provides data to an external memory and the like, and reads data of the external memory. The ALU 56 performs an arithmetic operation. The instruction register 57 temporarily stores data.

The logic portion 11 corresponds to the timing control 51, the instruction decoder 52, the register array 53, the address logic and buffer 54, the data bus interface 55, the ALU 56, and the instruction register 57. The detecting portion 13 is connected to each of the circuits included in the logic portion, 11 and to the Vth control 14. The Vth control 14 is connected to each of the circuits in the logic portion 11 and to the detecting portion 13.

Embodiment 3

Figure 6A:
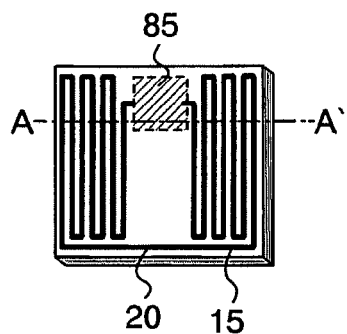
FIGS. 6A to 6D are illustrating describing constitution of semiconductor devices of the invention.
Figure 6B:
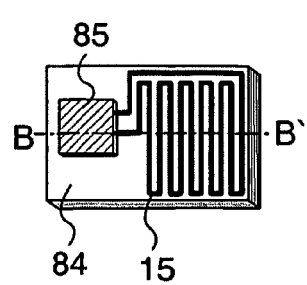
Figure 6C:
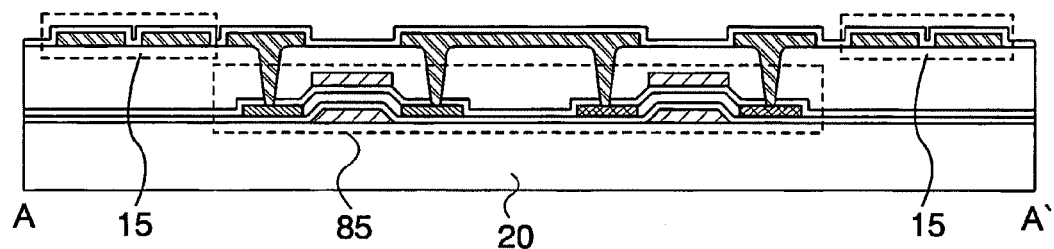
Figure 6D:
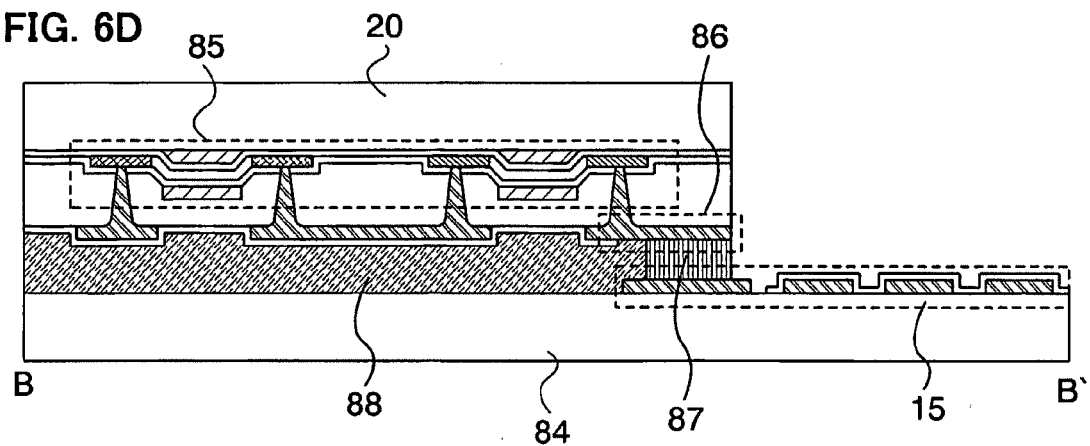

According to a semiconductor device of the invention, data reading and data writing can be performed in a noncontact manner, and any one of data transmission methods can be employed which are generally classified into three methods, that is, an electromagnetic coupling method by which data communication is performed by mutual induction by a couple of coils being provided so as to face each other, an electromagnetic induction method by which data communication is performed by an induction electromagnetic field, and a radio wave method by which data communication is performed by utilizing radio waves. The antenna 15 for transmitting data is provided in two manners, that is, the case where the antenna 15 is provided over the substrate 20 having a plurality of transistors (see FIGS. 6A and 6C), and the case where a terminal portion is provided over the substrate 20 having a plurality of transistors and the antenna 15 is provided to connect to the terminal portion (see FIGS. 6B and 6D). The plurality of transistors provided over the substrate 20 is called an element group 85 herein.

In the former structure (FIGS. 6A and 6C), the element group 85 constituting the logic portion 11 and the like, and a conductive film functioning as the antenna 15 are provided over the substrate 20. In the drawings, the conductive film functioning as the antenna 15 is provided in the same layer as that of source and drain wirings. However, the invention is not limited to this structure. It is possible to provide the antenna 15 in the same layer as that of the first gate electrode or the second gate electrode, or to cover the element group 85 with an insulating film and provide the antenna 15 over the insulating film.

In the latter structure (FIGS. 6B and 6D), the element group 85 and a terminal portion 86 are provided over the substrate 20. In the drawings, a source or drain wiring of transistors included in the element group 85 is used as the terminal portion 86. Moreover, the substrate 20 is attached to a substrate (a base) 84 such that the terminal portion 86 and the antenna 15 are connected to each other. Conductive particles 87 and resins 88 are interposed between the substrate 20 and the substrate 84.

The element group 85 can be provided at low cost by forming a plurality of the element groups 85 over a large substrate and then separating from one another. A quartz substrate, a glass substrate, and the like can be employed as the substrate, and preferably the glass substrate which has no restriction on size is employed.

The plurality of transistors included in the element group 85 may be provided in a plurality of layers. When forming the element group 85 in a plurality of layers, an interlayer insulating film is used, which is preferably formed of a resin material such as epoxy resin or acrylic resin, a transmissive resin material such as polyimide resin, a compound material produced by polymerization such as siloxane polymer, a material containing water-soluble homopolymer and water-soluble copolymer, or an inorganic material.

A siloxane compound material has a bond of silicon and oxygen as a backbone structure and contains hydrogen as a substituent or further contains at least one of fluorine, an alkyl group, and aromatic hydrocarbon as a substituent. Furthermore, as a material for the interlayer insulating film, a low permittivity (low-k) material is preferably employed in order to reduce parasitic capacitance between layers. When the parasitic capacitance is reduced, high-speed operation and low power consumption can be achieved.

As an active layer of each of the transistors in the element group 85, any one of an amorphous semiconductor, a microcrystalline semiconductor, a polycrystalline semiconductor, an organic semiconductor can be employed, though in particular, an active layer crystallized using a metal element as a catalyst or an active layer crystallized by laser irradiation is preferably used in order to obtain a transistor having a good property. Furthermore, a semiconductor layer formed by plasma CVD using an $SiH_4/F_2$ gas or an $SiH_4/H_2$ gas, or a layer obtained by irradiating laser to the semiconductor layer may be preferably used as the active layer.

For the plurality of transistors in the element group 85, a crystalline semiconductor layer crystallized at a temperature of 200 to 600° C. (preferably 350 to 500° C.) (a low-temperature polysilicon layer) or a crystalline semiconductor layer crystallized at a temperature of 600° C. or more (a high-temperature polysilicon layer) can be employed. Note that in the case where a high-temperature polysilicon layer is to be formed over a substrate, a quartz substrate can be employed as well as a glass substrate.

It is desirable that hydrogen or halogen be added to an active layer (particularly, a channel forming region) of each of the transistors in the element group 85 at a concentration of $1 \times 10^{19}$ to $1 \times 10^{22}$ atoms/cm$^3$, and more preferably $1 \times 10^{19}$ to $5 \times 10^{20}$ atoms/cm$^3$. According to this, an active layer with few defects, where few cracks are generated, can be obtained.

In addition, a barrier film for preventing a contaminant such as an alkaline metal is preferably provided so as to cover the transistors in the element group 85 or the element group 85 itself. According to this, such element group 85 that is free from contamination and has improved reliability can be obtained. Note that the barrier film may be formed with a silicon nitride film, a silicon nitride oxide film, a silicon oxynitride film, or the like.

The thickness of the active layer of the transistor in the element group 85 is 20 to 200 nm, preferably 40 to 170 nm, more preferably 45 to 55 nm or 145 to 155 nm, and still more preferably 50 nm or 150 nm According to this, the element group 85 where few cracks are generated even when it is bent can be obtained.

Furthermore, crystals constituting the active layer of the transistor in the element group 85 are preferably formed such that the crystal grain boundary thereof extends parallel to the flowing direction of carriers (the channel length direction). Such an active layer can be formed using a continuous wave laser (CWLC) or a pulsed laser operating at a frequency of 10 MHz or more, and preferably 60 to 100 MHz.

The transistor in the element group 85 preferably has an S value (subthreshold value) of 0.35 V/sec or less (preferably, 0.09 to 0.25 V/sec) and a mobility of 10 cm$^2$/Vs or more. Such properties can be achieved by forming the active layer using a continuous wave laser or a pulsed laser operating at a frequency of 10 MHz or more.

Further, the element group 85 has a frequency of 1 MHz or more, and preferably 10 MHz or more at the ring oscillator level (at a voltage of 3 to 5 V). Alternatively, the property of frequency thereof per gate is 100 kHz or more, and preferably 1 MHz or more (at a voltage of 3 to 5 V).

Figure 7A:
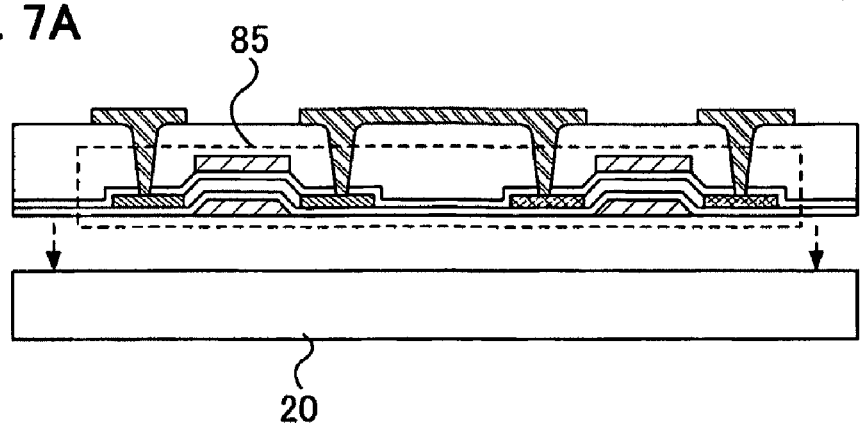
FIGS. 7A to 7D are diagrams illustrating constitution of a semiconductor device of the invention.
Figure 7B:
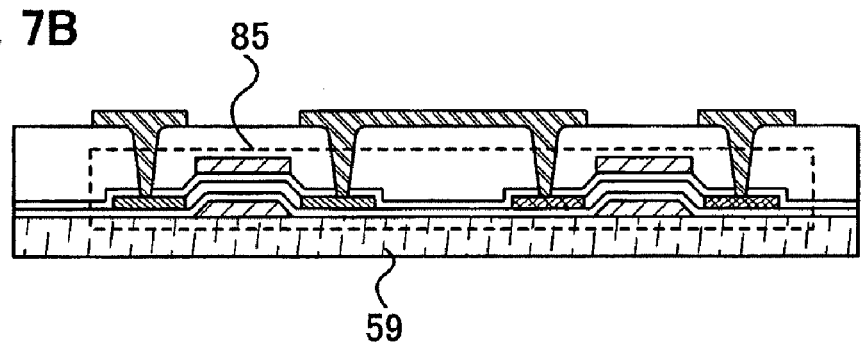

The element group 85 is formed over the substrate 20 formed of glass, quartz or the like. The element group 85 over the substrate 20 may be used as it is, or may be peeled off from the substrate 20 (see FIG. 7A) and then attached to a flexible substrate 59 (see FIG. 7B) in order to add further value. As the flexible substrate 20, a plastic substrate such as polycarbonate, polyarylate, polyether sulfone and a polytetrafluoroethylene substrate, a ceramic substrate or the like can be employed.

The element group 85 can be peeled off from the substrate 20 by a method of removing a peel-off layer provided between the substrate 20 and the element group 85 by an etchant, or by a method of removing the peel-off layer partially by an etchant and then physically peeling off the element group 85 from the substrate 20. Note that the physical peeling is to peel by a stress applied externally, for example, a stress due to gas pressure by gas sprayed from a nozzle or ultrasonic waves.

Alternatively, the element group 85 may be peeled off from the substrate 20 by (1) a method such that a metal oxide film is formed between the high heat-resistant substrate 20 and the element group 85, and the metal oxide film is weakened by crystallization, thereby peeling off the element group 85; (2) a method such that an amorphous silicon film containing hydrogen is formed between the high heat-resistant substrate 20 and the element group 85, and the amorphous silicon film is removed by laser irradiation or etching, thereby peeling off the element group 85; (3) a method such that the high heat-resistant substrate 20 over which the element group 85 is formed is removed mechanically or by etching using a solution or a gas such as $ClF_3$, $ClF_2$, $ClF$, or $BrF_3$, thereby peeling the element group 85; or the like. The peeled element group 85 can be attached to the substrate 59 with a commercial adhesive such as an epoxy resin adhesive or a resin additive.

Figure 7C:
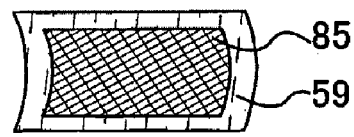
Figure 7D:

As set forth above, by attaching the element group 85 to the second substrate 59, which is flexible, a thin, light and highly impact-resistant semiconductor device can be provided (see FIG. 7C). Further, the flexibility enables to attach the semiconductor device to a curved surface or an irregular shaped surface, leading to various applications. For example, a wireless tag 61 that is one mode of the semiconductor device of the invention can be attached close to a curved surface such as a medicine bottle (see FIG. 7D). If the substrate 20 is reused, cost for the semiconductor device can be reduced. In addition, the flexible substrate 59 is inexpensive as compared with the substrate 20, thereby reducing the cost for the semiconductor device. This embodiment can be implemented in free combination with the aforementioned embodiment mode and embodiments.

Embodiment 4

Figure 10A:
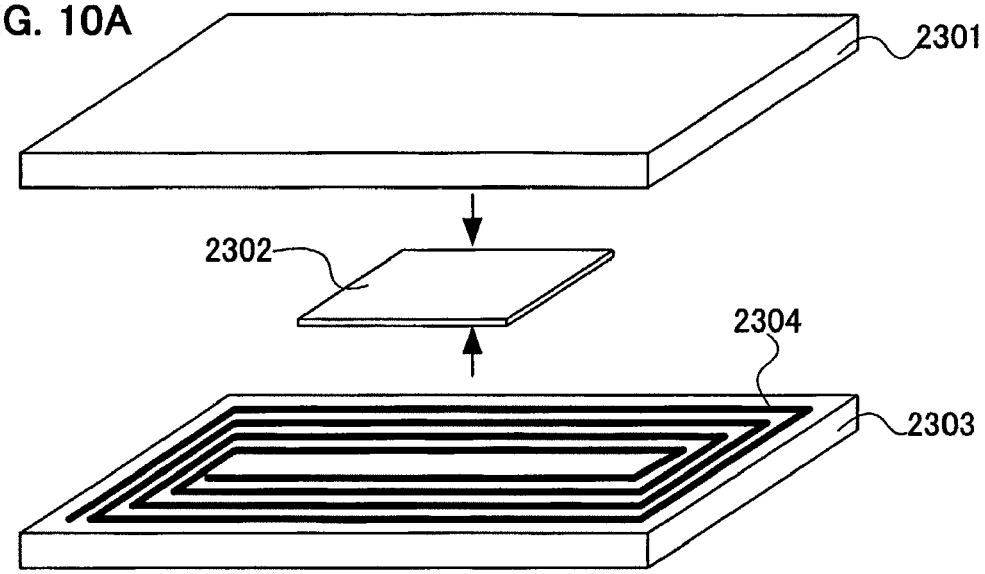
FIGS. 10A to 10C are diagrams illustrating constitution of a semiconductor device of the invention.

In this embodiment, a flexible wireless tag formed by a peeling process is described (see FIG. 10A). The wireless tag includes a flexible protective layer 2301, a flexible protective layer 2303 having an antenna 2304, and an element group 2302 formed by a peeling process. The antenna 2304 formed over the protective layer 2303 is electrically connected to the element group 2302. Although the antenna 2304 is formed only over the protective layer 2303 in the drawing, the invention is not limited to this and the antenna 2304 may be additionally formed adjacent to the protective layer 2301. Note that a barrier film is preferably formed between the element group 2302 and the protective layers 2301 and 2303 using a silicon nitride film or the like. According to this, a wireless tag having high reliability can be provided so as not to contaminate the element group 2303.

The antenna 2304 is desirably formed of silver, copper, or metal coated with them. The antenna 2304 and the element group 2302 are connected to each other by UV treatment or ultrasonic treatment using an anisotropic conductive film, though the invention is not limited to this connecting method and various methods can be adopted.

Figure 10B:
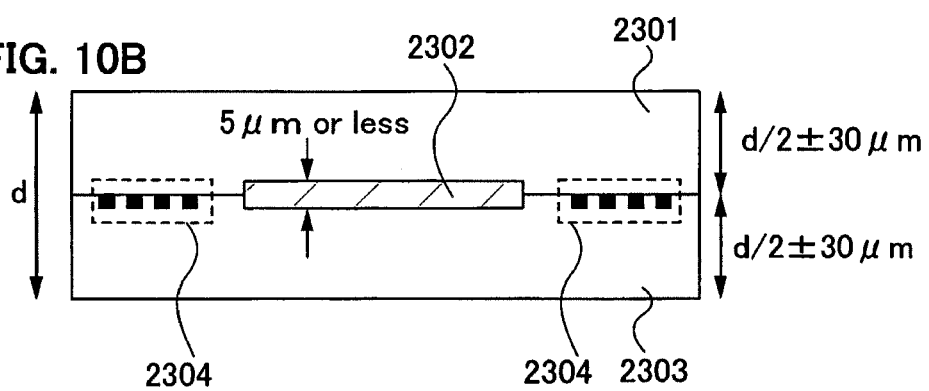

The element group 2302 sandwiched between the protective layers 2301 and 2303 may have a thickness of 5 μm or less, and preferably a thickness of 0.1 to 3 μm (see FIG. 10B showing a cross sectional structure). When the total thickness of the protective layers 2301 and 2303 is d, the thickness each of the protective layers 2301 and 2303 is preferably set to be $(d/2)\pm 30$ μm, and more preferably $(d/2)\pm 10$ μm. It is desirable that the protective layers 2301 and 2303 each have a thickness of 10 to 200 μm. The area of the element group 2302 is 5 mm square (25 $mm^2$) or less, and preferably 0.3 to 4 mm square (0.09 to 16 $mm^2$).

The protective layers 2301 and 2303, which are formed of an organic resin material, have a property of being resistant to bending. The element group 2302 itself formed by a peeling process is also resistant to bending as compared with a single crystalline semiconductor. The element group 2302 can be attached close to the protective layers 2301 and 2303 without any space therebetween, thereby a completed wireless tag itself can have a structure resistant to bending. Such element group 2302 sandwiched between the protective layers 2301 and 2303 may be disposed on a surface of or inside an object, or mounted inside a piece of paper.

Figure 10C:
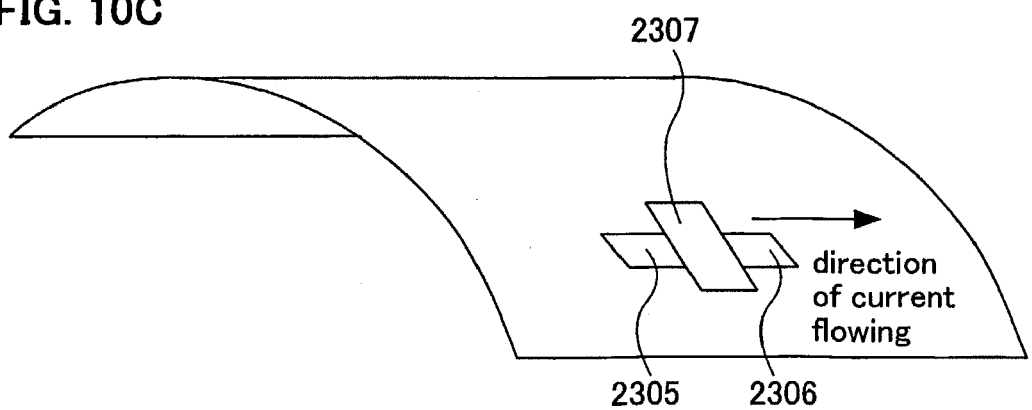

Described next is the case of attaching the element group formed by a peeling process to a substrate having a curved surface (see FIG. 10C). One transistor selected from the element group formed by a peeling process is illustrated in FIG. 10C. This transistor is formed linearly in the direction of current flowing. In other words, a drain electrode 2305, a gate electrode 2307 and a source electrode 2306 are arranged linearly. In addition, the direction of an arc drawn by the substrate is perpendicular to that of current flowing. According to such a structure, it is possible to reduce the effect of stress and suppress variations in characteristics of transistors included in the element group even when the substrate is bent to draw an arc.

Further, in order to prevent an active element such as a transistor from being damaged by stress, it is desirable that an active region (a silicon island portion) of the active element occupy 5 to 50% (preferably, 5 to 30%) of the whole area of the substrate. In a region where no active element such as a TFT is provided, a base insulating film material, an interlayer insulating film material and a wiring material are mainly provided. A region other than the active region of a transistor and the like preferably occupies 60% or more of the whole area of the substrate. According to such a structure, a highly integrated semiconductor device and easily bendable can be provided.

Figure 8A:
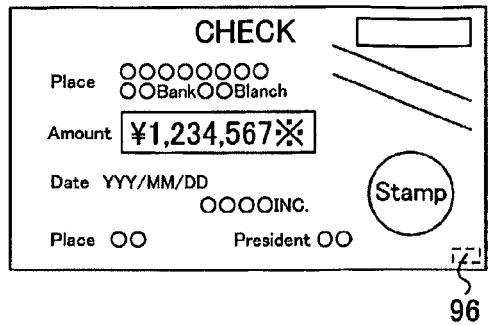
FIGS. 8A to 8H are views illustrating applications of a semiconductor device of the invention.
Figure 8B:
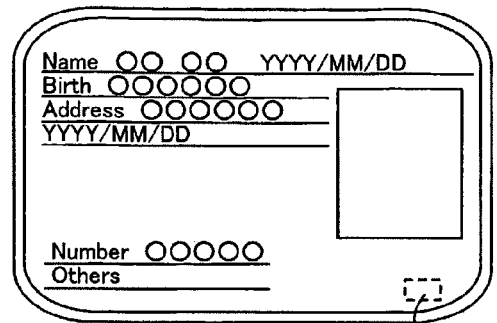
Figure 8C:
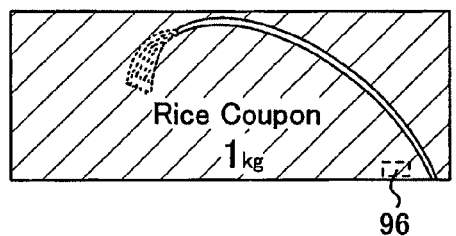
Figure 8D:
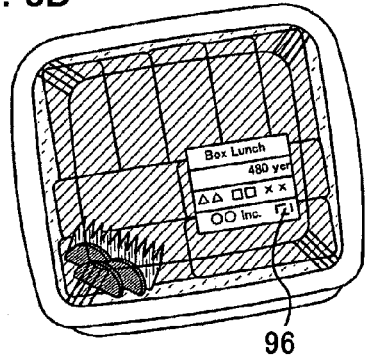
Figure 8E:
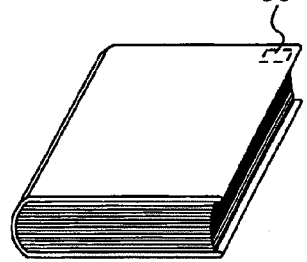
Figure 8F:
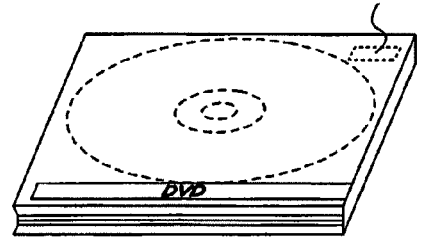
Figure 8G:
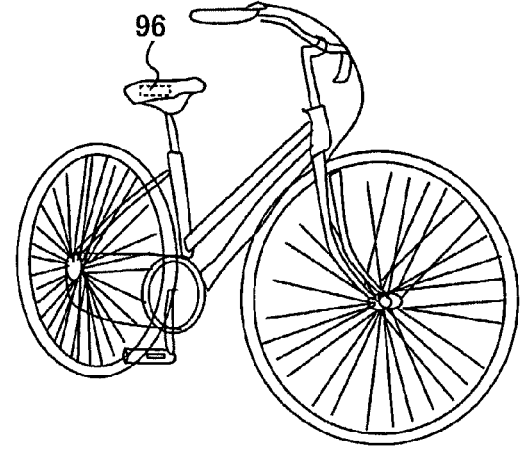
Figure 8H:
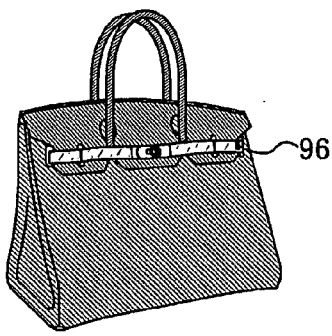

A semiconductor device of the invention can be applied to various fields. A wireless tag that is one mode of the semiconductor device of the invention, for example, can be mounted on bills, coins, securities, certificates, bearer bonds, packing containers, books, a recording medium, personal items, vehicles, food items, clothing, healthcare items, livingwares, medicals, an electronic apparatus, and the like. The bills and the coins mean currency in the market and include a note that is a currency in a specific area (a cash voucher), memorial coins and the like. The securities mean a check, a stock certificate, a promissory note, and the like (see FIG. 8A). The certificates mean a driver's license, a resident card and the like (see FIG. 8B). The bearer bonds mean a stamp, various gift coupons and the like (see FIG. 8C). The packing containers mean a wrapping paper for a lunch box or the like, a plastic bottle and the like (see FIG. 8D). The books mean a book, a volume and the like (see FIG. 8E). The recording medium means DVD software, a video tape and the like (see FIG. 8F). The personal items mean a bag, glasses and the like (see FIG. 8G). The vehicles mean a wheeled vehicle such as a bicycle, a vessel and the like (see FIG. 8H). The food items mean foods, beverages and the like. The clothing mean wear, footwear and the like. The healthcare items mean medical devices, health appliances and the like. The livingwares mean furniture, a lighting apparatus and the like. The medicals mean medicines, agricultural chemicals and the like. The electronic apparatus means a liquid crystal display device, an EL display device, a TV receiver (a TV set, a television device, and a thin television device), a mobile phone, and the like. When a wireless tag is mounted on the bills, the coins, the securities, the certificates, the bearer bonds, and the like, counterfeiting thereof can be prevented. When a wireless tag is mounted on the packing containers, the books, the recording medium, the personal items, the food items, the livingwares, the electronic apparatus, and the like, the efficiency of the inspection system, the rental system and the like can be improved. When a wireless tag is mounted on the vehicles, the healthcare items, the medicals and the like, counterfeiting and theft thereof can be prevented and the medicines can be prevented from being taken in the wrong manner The wireless tag may be attached to a surface of a product or mounted inside a product. For example, the wireless tag may be mounted inside a page of a book, or mounted inside an organic resin of a package.

Figure 9A:
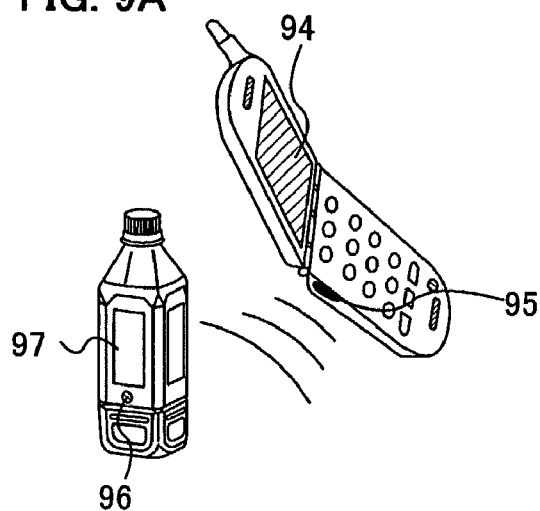
FIGS. 9A and 9B are views illustrating applications of a semiconductor device of the invention.
Figure 9B:
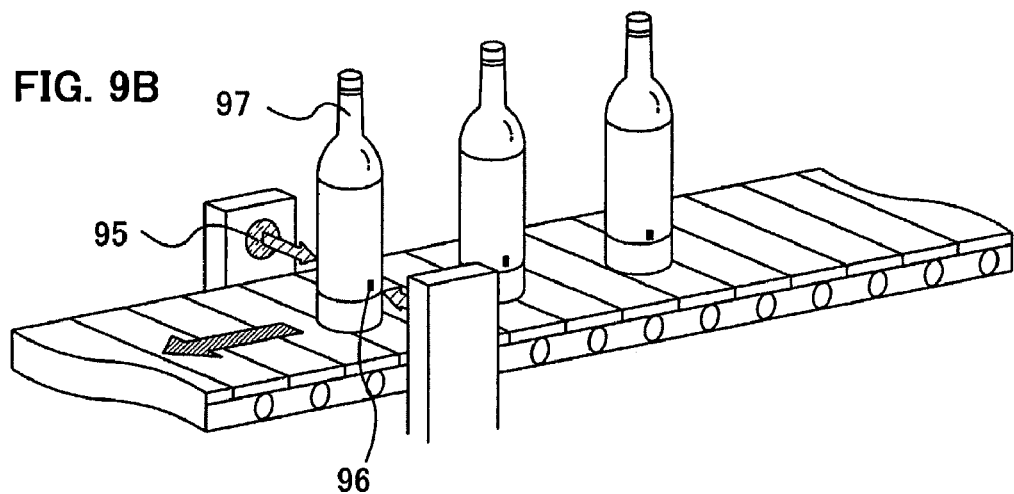

When the invention is thus applied to product management or distribution system, high performance system can be achieved. For example, a reader/writer 95 is provided on the side of a portable terminal including a display portion 94 while a wireless tag 96 that is one mode of the semiconductor device of the invention is provided on the side of a product 97 (see FIG. 9A). In this case, when the wireless tag 96 is put close to the reader/writer 95, the display portion 94 displays data on the product 97 such as ingredients, a place of origin, and a record of the distribution process. Conventionally, the data on the product 97 is limited to the one shown on a label. Meanwhile, a larger amount of data can be obtained by providing the wireless tag 96. As another example, the reader/writer 95 can be provided beside a conveyor belt (see FIG. 9B). In such a case, the product 97 can be inspected easily. This embodiment can be implemented in free combination with the aforementioned embodiment mode and embodiments.

EXPLANANTION OF REFERENCE

11: logic portion, 12: memory portion, 13: detecting portion, 14: Vth control, 15: antenna, 18: reader/writer, 20: substrate, 21: n-type transistor, 22: p-type transistor, 23: second gate electrode, 24: second gate electrode, 25: second gate insulating film, 26: source or drain region, 27: source or drain region, 28: source or drain region, 29: source or drain region, 30: channel forming region, 31: channel forming region, 32: first gate insulating film, 33: first gate electrode, 34: first gate electrode, 35: source or drain wiring, 36: source or drain wiring, 37: source or drain wiring, 51: timing control, 52: instruction decoder, 53: register array, 54: address logic and buffer, 55: data bus interface, 56: ALU, 57: instruction register, 59: substrate, 60: substrate, 61: wireless tag, 63: memory, 64: D/A converter portion, 65: buffer, 70: address bus, 71: address comparator, 72: address memory, 73: counter, 74: reset signal generating circuit, 75: discriminating circuit, 76: discriminating reference data memory, 77: EXOR circuit, 78: EXOR circuit, 79: EXOR circuit, 80: EXOR circuit, 81: NOR circuit, 82: latch circuit, 84: substrate, 85: element group, 86: terminal portion, 87: conductive particle, 88: resin, 91: curve, 92: curve, 93: curve, 94: display portion, 95: reader/writer, 96: wireless tag, 97: product, 2301: protective layer, 2302: element group, 2303: protective layer, 2304 antenna, 2305 drain electrode, 2306 source electrode, 2307 gate electrode

What is claimed is:

1. A semiconductor device comprising:
    a first portion;
    a second portion;
    a third portion configured to detect an operation frequency of the first portion or an operation frequency of the second portion;
    a fourth portion configured to supply a Vth control signal to the first portion or the second portion depending on a detection result from the third portion; and
    a wiring electrically connected to the first portion,
    wherein each of the first portion and the second portion comprises at least one transistor,
    wherein the at least one transistor has a first gate electrode which is input with a first signal and a second gate electrode which is input with the Vth control signal, and
    wherein at least the first portion is provided with electric power from the wiring.

2. The semiconductor device according to claim 1, wherein the first portion includes a logic circuit, and
    wherein the second portion includes a memory circuit.

3. The semiconductor device according to claim 1,
    wherein the first portion comprises more than one of a control circuit, an arithmetic circuit, an input/output circuit, a power source circuit, a clock generating circuit, a data demodulation/modulation circuit, and an interface circuit.

4. The semiconductor device according to claim 1,
    wherein the first portion comprises a timing control, an instruction decoder, a register array, an address logic and buffer, a data bus interface, an ALU (Arithmetic Logic Unit), and an instruction register.

5. The semiconductor device according to claim 1, wherein the second portion comprises one or more of a DRAM, an SRAM, an FeRAM, a masked ROM, a fuse PROM, an anti-fuse PROM, EPROM, an EEPROM, and a flash memory.

6. The semiconductor device according to claim 1, wherein the third portion is a program or a storage medium storing the program.

7. A semiconductor device comprising:
    a first portion;
    a second portion;
    a detecting portion for detecting at least one of an operation frequency of the first portion and an operation frequency of the second portion;
    a Vth control portion for supplying a Vth control signal to at least one of the first portion and the second portion depending on a detection result from the detecting portion; and
    a wiring electrically connected to the first portion,
    wherein each of the first portion and the second portion comprises at least one transistor,
    wherein the at least one transistor has a first gate electrode which is input with a first signal and a second gate electrode which is input with the Vth control signal, and
    wherein at least the first portion is provided with electric power from the wiring.

8. The semiconductor device according to claim 7, wherein the first portion includes a logic circuit, and
    wherein the second portion includes a memory circuit.

9. The semiconductor device according to claim 7,
    wherein the first portion comprises more than one of a control circuit, an arithmetic circuit, an input/output circuit, a power source circuit, a clock generating circuit, a data demodulation/modulation circuit, and an interface circuit.

10. The semiconductor device according to claim 7,
    wherein the first portion comprises a timing control, an instruction decoder, a register array, an address logic and buffer, a data bus interface, an ALU (Arithmetic Logic Unit), and an instruction register.

11. The semiconductor device according to claim 7,
    wherein the second portion comprises one or more of a DRAM, an SRAM, an FeRAM, a masked ROM, a fuse PROM, an anti-fuse PROM, EPROM, an EEPROM, and a flash memory.

12. The semiconductor device according to claim 7, wherein the detecting portion is a program or a storage medium storing the program.

13. A semiconductor device comprising:
    a first portion;
    a second portion;
    a third portion configured to detect an operation frequency of the first portion or an operation frequency of the second portion;

a fourth portion configured to supply a Vth control signal to the first portion or the second portion depending on a detection result from the third portion; and a wiring electrically connected to the first portion, wherein each of the first portion and the second portion comprises at least one transistor, wherein the at least one transistor has a first gate electrode which is input with a first signal and a second gate electrode which is input with the Vth control signal, and a semiconductor film, wherein the semiconductor film is provided over the second gate electrode, wherein the first gate electrode is provided over the semiconductor film, and wherein at least the first portion is provided with electric power from the wiring.

14. The semiconductor device according to claim 13, wherein the first portion includes a logic circuit, and wherein the second portion includes a memory circuit.

15. The semiconductor device according to claim 13, wherein the first portion comprises more than one of a control circuit, an arithmetic circuit, an input/output circuit, a power source circuit, a clock generating circuit, a data demodulation/modulation circuit, and an interface circuit.

16. The semiconductor device according to claim 13, wherein the first portion comprises a timing control, an instruction decoder, a register array, an address logic and buffer, a data bus interface, an ALU (Arithmetic Logic Unit), and an instruction register.

17. The semiconductor device according to claim 13, wherein the second portion comprises one or more of a DRAM, an SRAM, an FeRAM, a masked ROM, a fuse PROM, an anti-fuse PROM, EPROM, an EEPROM, and a flash memory.

18. The semiconductor device according to claim 13, wherein the third portion is a program or a storage medium storing the program.

19. A semiconductor device comprising:

a first portion;

a second portion;

a detecting portion for detecting at least one of an operation frequency of the first portion and an operation frequency of the second portion;

a Vth control portion for supplying a Vth control signal to at least one of the first portion and the second portion depending on a detection result from the detecting portion; and a wiring electrically connected to the first portion, wherein each of the first portion and the second portion comprises at least one transistor, wherein the at least one transistor has a first gate electrode which is input with a first signal and a second gate electrode which is input with the Vth control signal, and a semiconductor film, wherein the semiconductor film is provided over the second gate electrode, wherein the first gate electrode is provided over the semiconductor film, and wherein at least the first portion is provided with electric power from the wiring.

20. The semiconductor device according to claim 19, wherein the first portion includes a logic circuit, and wherein the second portion includes a memory circuit.

21. The semiconductor device according to claim 19, wherein the first portion comprises more than one of a control circuit, an arithmetic circuit, an input/output circuit, a power source circuit, a clock generating circuit, a data demodulation/modulation circuit, and an interface circuit.

22. The semiconductor device according to claim 19, wherein the first portion comprises a timing control, an instruction decoder, a register array, an address logic and buffer, a data bus interface, an ALU (Arithmetic Logic Unit), and an instruction register.

23. The semiconductor device according to claim 19, wherein the second portion comprises one or more of a DRAM, an SRAM, an FeRAM, a masked ROM, a fuse PROM, an anti-fuse PROM, EPROM, an EEPROM, and a flash memory.

24. The semiconductor device according to claim 19, wherein the detecting portion is a program or a storage medium storing the program.

* * * * *